United States Patent [19]
Higashitani

[11] Patent Number: 5,426,608
[45] Date of Patent: Jun. 20, 1995

[54] WORD LINE REDUNDANCY NONVOLATILE SEMICONDUCTOR MEMORY

[75] Inventor: Masaaki Higashitani, Kawasaki, Japan

[73] Assignee: Fujitsu Limited, Kawasaki, Japan

[21] Appl. No.: 250,668

[22] Filed: May 27, 1994

[30] Foreign Application Priority Data

Sep. 20, 1993 [JP] Japan .................................. 5-233332

[51] Int. Cl.⁶ .............................................. G11C 7/00
[52] U.S. Cl. .................................... 365/200; 365/185; 365/218; 365/900
[58] Field of Search ................ 365/200, 900, 185, 218

[56] References Cited

U.S. PATENT DOCUMENTS

| | | | |
|---|---|---|---|
| 4,281,397 | 7/1981 | Neal et al. ............................ | 365/230 |
| 5,023,839 | 6/1991 | Suzuki et al. ........................ | 365/200 |
| 5,033,024 | 7/1991 | O'Connell et al. .................. | 365/200 |
| 5,077,691 | 12/1991 | Haddad et al. ..................... | 365/218 |
| 5,083,294 | 1/1992 | Okajima .............................. | 365/200 |
| 5,126,973 | 6/1992 | Gallia et al. ......................... | 365/200 |
| 5,185,718 | 2/1993 | Rinerson et al. ................... | 365/185 |

FOREIGN PATENT DOCUMENTS

0537973A2 4/1993 European Pat. Off. .
5-198190 8/1993 Japan .
2254173 9/1992 United Kingdom .
89/06429 7/1989 WIPO .

OTHER PUBLICATIONS

Patent Abstracts of Japan, vol. 17, No. 626 (P-1647) & JP-A-05 198 190 Aug. 6, 1993.

Primary Examiner—Joseph A. Popek
Assistant Examiner—Son Dinh
Attorney, Agent, or Firm—Nikaido, Marmelstein, Murray & Oram

[57] ABSTRACT

An object of the present invention is to realize a flash memory in which word redundancy can be implemented. In a nonvolatile semiconductor memory of the present invention in which word redundancy is implemented to replace a faulty memory cell with a redundancy nonvolatile memory cell in units of a word line, source lines are a plurality of lines arranged in a one-to-one correspondence with and in parallel with word lines. The source lines are connected to a first common source line via first switching means that are selectively allowed to conduct owing to voltage applied to word lines for reading or writing. The source lines are connected to a second common source line via second switching means that conduct for erasing.

10 Claims, 12 Drawing Sheets

WORD LINE REDUNDANCY NONVOLATILE SEMICONDUCTOR MEMORY

BACKGROUND OF THE INVENTION

1. Field of the Invention

The present invention relates to a nonvolatile semiconductor memory that can be completely or partially electrically erased at one fine and which is referred to as a flash memory. More particularly, this invention is concerned with a word line redundancy flash memory in which a faulty memory cells are replaced with redundant memory cell in units of a word line.

2. Description of the Related Art

In recent years, in the field of nonvolatile memories, efforts have been made to develop an element having a cell structure that enables electrical rewriting of data, permits low cost per bit, realizes downsizing, and offers a large storage capacity. This aims at replacement of magnetic memory media with semiconductor memories. A cell structure for realizing a large storage capacity and low cost is a one-transistor-per-one-cell structure in which, similarly to the cell structure of an EPROM, each cell has a single floating gate.

Even in a flash memory, redundancy, that is a technology for replacing faulty memory cells with spare redundant memory cells, is implemented in an effort to improve production yield.

When redundancy is implemented in a DRAM or SRAM, all memory cells on a row or column to which a faulty memory cell belongs are replaced. Specifically, assuming that the direction of a word line is regarded as a row and the direction of a bit line is regarded as a column, when row (word line) redundancy is attempted, one or more redundant word lines and memory cells to be connected on the rows of the word lines are prepared, and then a word line on which a faulty memory cell is connected is replaced with the redundant word line. Replacement can be repeated for the number of redundant word lines prepared. When column redundancy is attempted, similarly to the row redundancy, one or more redundant bit lines and memory cells to be connected on the columns of the bit lines are prepared, and then a bit line on which a faulty memory cell is connected is replaced with a redundant bit line.

In a conventional flash memory, row redundancy is difficult to realize because of an excessively erased cell. When excessive electrons are drawn out of a floating gate of a memory cell during erasure, the floating gate becomes positive. Even if the memory cell is unselected, leakage current flows through the bit line on which the memory cell is connected. As a result, reading cannot be achieved correctly. This memory cell is referred to as an excessive-erasure cell.

In a flash memory, as described above, erasing is achieved by applying high voltage to the common source line and grounding all word lines in a block. Since the word lines are grounded, the conditions for erasing are applied to all memory cells connected on the replaced word line. Writing is not performed to the memory cells connected to the replaced word line. Therefore, after erasing is executed several times, the memory cells are placed in an excessive-erasure state without fail. Therefore, row redundancy is difficult to implement in a flash memory.

Generally, word lines underlie bit lines. In the process of manufacturing, word lines are formed in an earlier stage than bit lines. The probability of occurrence of a fault resulting from adherent dust or the like is higher in word lines than in bit lines. It is therefore desired that not only bit-line redundancy but also word-line redundancy be performed.

SUMMARY OF THE INVENTION

An object of the present invention is to realize a flash memory enabling row (word-line) redundancy.

A nonvolatile semiconductor memory according to the present invention comprises a plurality of word lines; a plurality of bit lines which are perpendicular to the word lines, and a plurality of nonvolatile memory cells each of which includes a control electrode connected to one of the word lines, a first electrode connected to one of the bit lines, and a second electrode connected to one of source lines. The nonvolatile semiconductor memory further comprises one or more redundant word lines and a plurality of redundant nonvolatile memory cells each of which includes a control electrode connected to one of the redundant word lines, a first electrode connected to one of the bit lines, and a second electrode connected to one of the source lines. In the nonvolatile semiconductor memory, row redundancy is implemented so that when faults occur in the nonvolatile memory cell, the redundant word lines are used to replace the faulty memory cell with the redundant nonvolatile memory cell in units of a word line. In order to achieve the foregoing object, the source lines are realized with a plurality of lines arranged in a one-to-one correspondence with and in parallel with the word lines. The source lines are connected to a first common source line via first switch means that have the gates thereof connected to the word lines and selectively conduct owing to voltage applied to the word lines for reading or writing. The source lines are connected to a second common source line via second switching means that conduct for erasing.

The present applicant has disclosed in Japanese Patent Application No.4-6755 a flash memory in which source lines are arranged in parallel with and in a one-to-one correspondence with word lines. The flash memory includes switch means driven with a signal applied to word lines and installed on the source lines, so that only a source line on which a selected nonvolatile memory cell is connected can be selected and connected to a common source line having a given voltage for reading or writing. By applying this configuration to a flash memory in which word redundancy is implemented, the problem that excessive erasure occurs in a replaced nonvolatile memory cell can be solved.

In a nonvolatile semiconductor memory according to the present invention, for reading, a source line on which a nonvolatile memory cell concerned is connected, is selectively connected to the first common source line, and the other source lines are placed in a floating state. During reading, the source lines of nonvolatile memory cells connected to a replaced word line are therefore in a floating state. Even if the nonvolatile memory cells enter an excessive-erasure state, no current flows into the nonvolatile memory cells through the bit lines, so reading of nonvolatile memory cells connected to the bit lines will not be affected adversely.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Before proceeding to a detailed description of the preferred embodiments of the present invention, prior art flash memories will be described for a clearer understanding of the differences between the present invention and the prior art.

Figure 1:
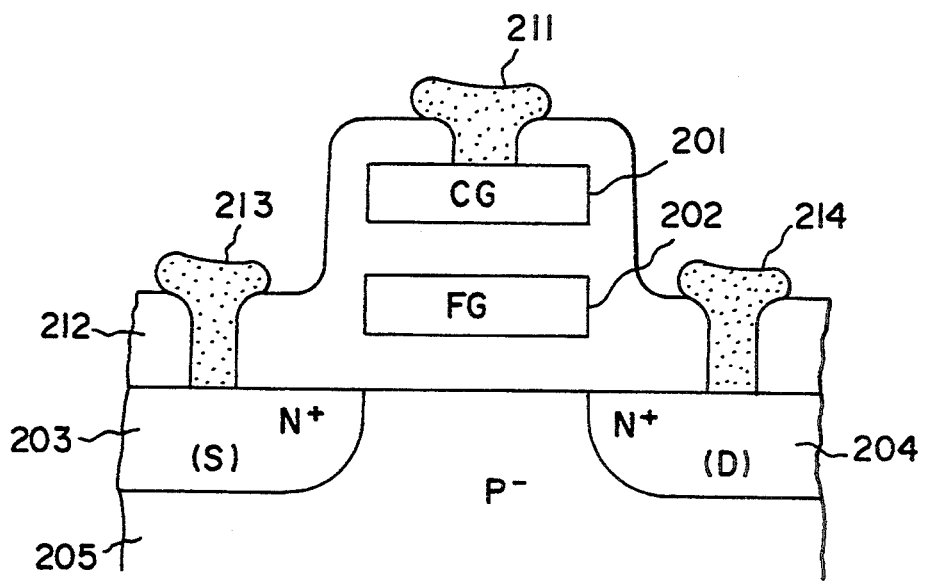
FIG. 1 shows a cell structure in a flash memory.

FIG. 1 shows an example of a typical cell structure for a flash memory.

In FIG. 1, reference numeral 201 denotes a control electrode (or control gate (CG)); 202 denotes a floating gate (FG); 203 denotes a source (S); 202 denotes a drain (D); 205 denotes a substrate (base) that is coated with an oxide film 212; 211 denotes a word line connected to the control gate 201; and 214 denotes a bit line connected to the drain 204. A tunnel oxide film is interposed between the floating gate 202 and base 205.

Figure 2A:
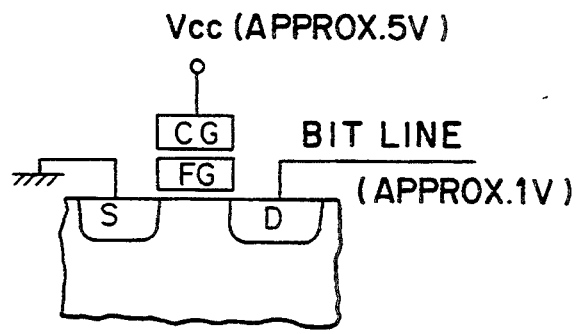
FIGS. 2A to 2C are explanatory diagram showing methods of reading, writing, and erasing a flash memory.
Figure 2B:
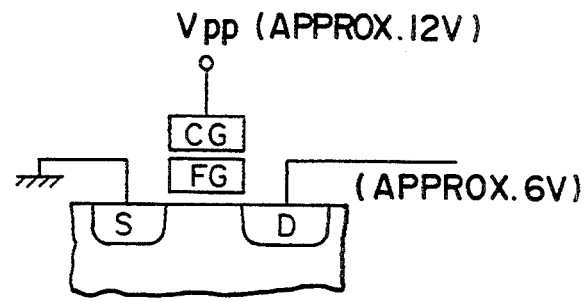
Figure 2C:
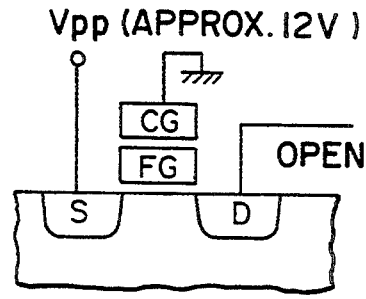

FIGS. 2A to 2C are explanatory diagrams showing methods of reading, writing, and erasing a flash memory. FIG. 2A shows a reading method. FIG. 2B shows a writing method. FIG. 2C shows an erasing method.

As shown in FIG. 2A, for reading a flash memory, similarly to reading an EPROM, 0 V is applied to a source, about 1 V is applied to a drain (bit line), and about 5 V is applied to a control gate (word line). A sense amplifier then determines whether current flows through the bit line. For writing, as shown in FIG. 2B, 0 V is applied to a source B, about 6 V is applied to a drain D, and about 12 V is applied to a control gate CG. This causes an avalanche breakdown to occur in the vicinity of the drain. Thermions resulting from the avalanche breakdown are then injected into the floating gate FG. For erasing, as shown in FIG. 2C, about 10 V is applied to the source B, the drain D is open, and about 0 V is applied to the control gate CG. A high-intensity electric field is then applied between the floating gate FG and source S. Due to a resultant Fowler-Nordheim tunneling effect, electrons are drawn out from the floating gate FG to the source S. The source is connected to a common line. Erasing is performed on all cells connected to the common source line. Note that all electrodes are named in consideration of relationships between drains and sources which are determined by the conditions for reading. For convenience sake, the names are used for writing and erasing alike. That is to say, electrodes connected to bit lines are referred to as drains irrelevant of operation modes.

As described above, even in a flash memory, redundancy, i.e., a technology for replacing faulty memory cells with a spare redundant memory cell, is implemented.

Figure 3:
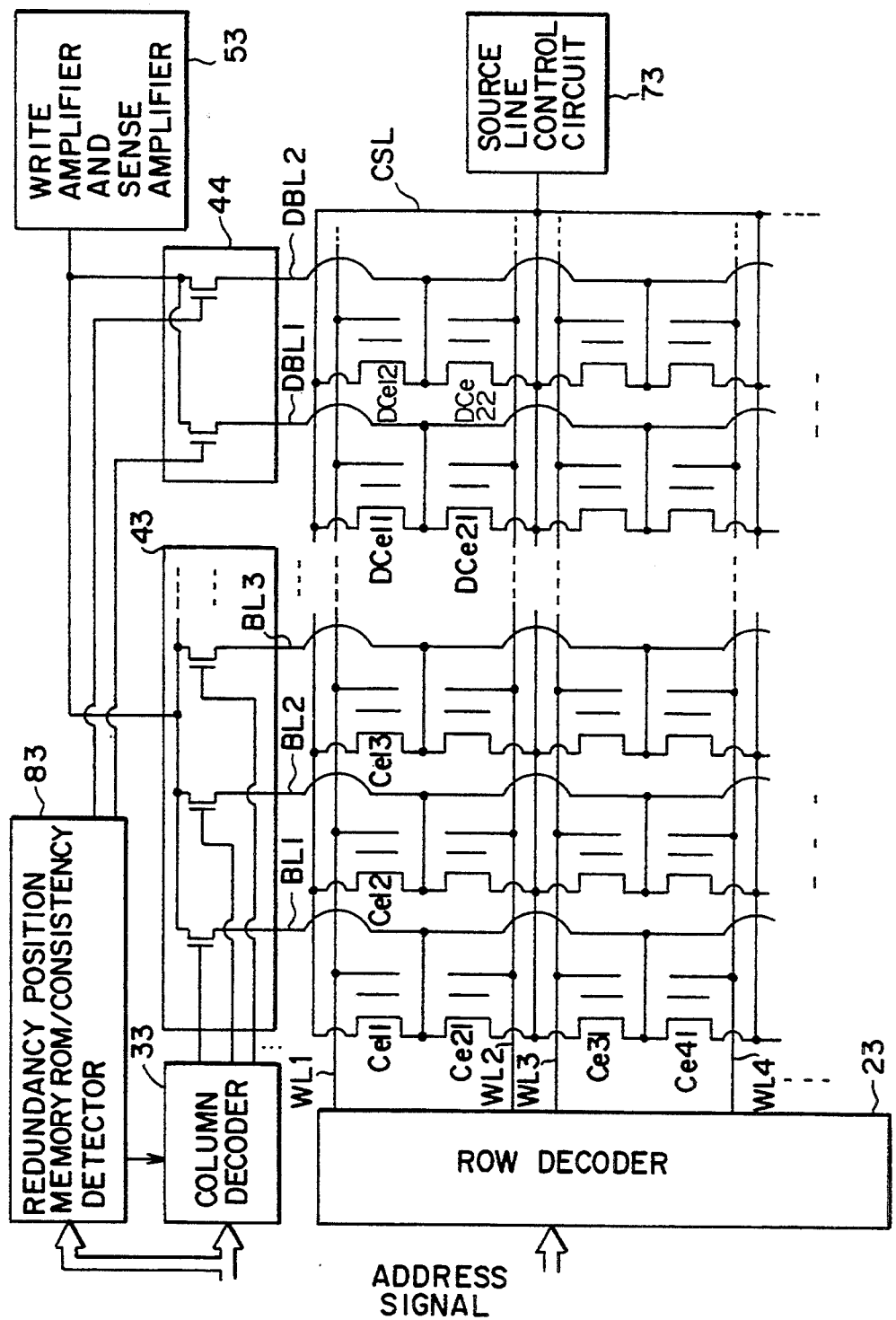
FIG. 3 shows a configuration of a conventional flash memory in which column redundancy is implemented.
Figure 4:
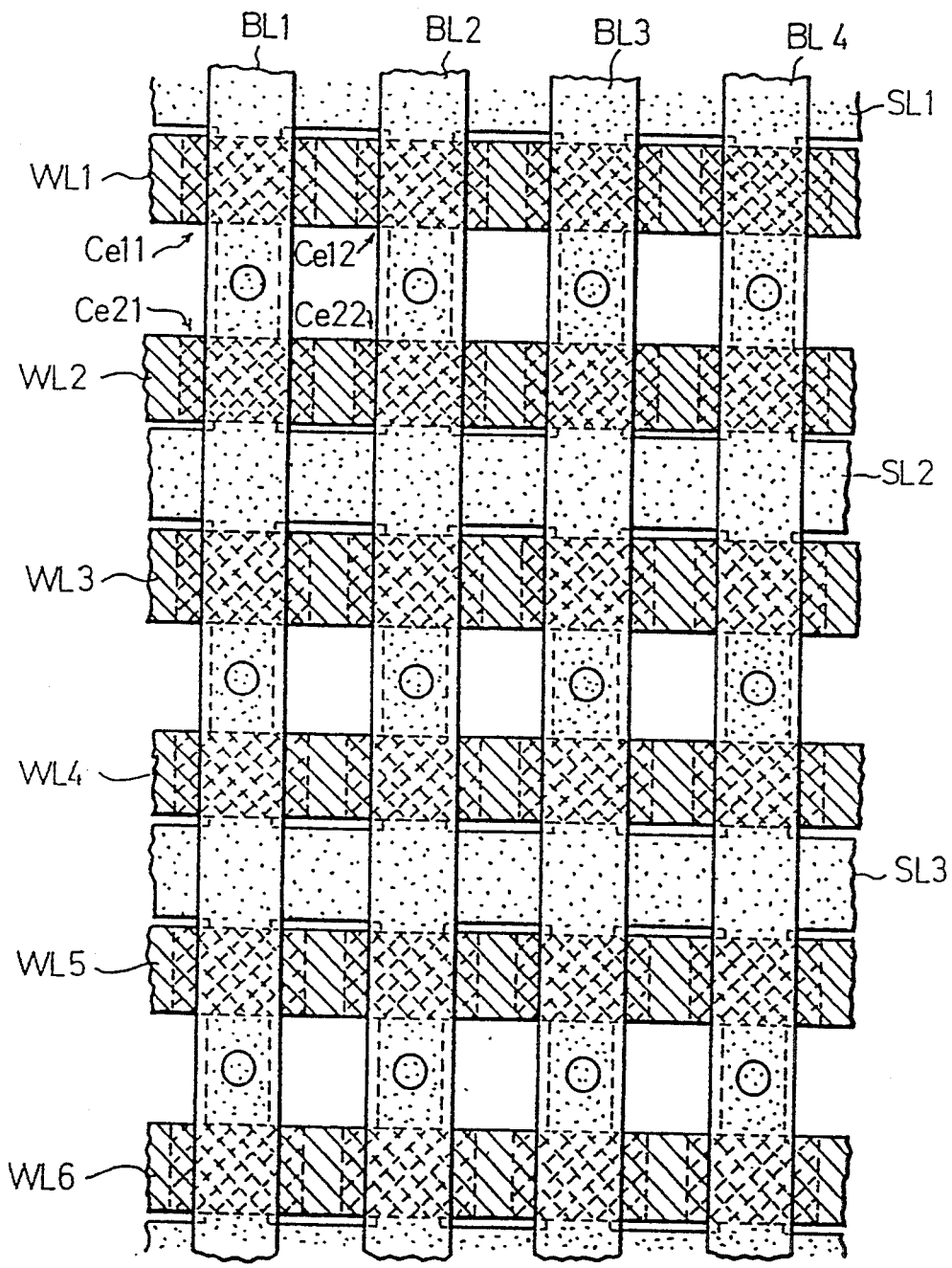
FIG. 4 is a plan view showing a cell matrix in the flash memory in FIG. 3.

FIG. 3 shows the configuration of a conventional flash memory in which column redundancy is implemented. FIG. 4 is a plan view of a cell matrix in the flash memory.

In FIGS. 3 and 4, WL1, WL2, etc., and WLn denote word lines; BL1, BL2, etc., and BLn denote bit lines; Ce11, Ce12, etc., and Cemn (m and n are positive integers) denote memory cells; CSL denotes a source line; DWL1 and DWL2 denote redundancy word lines; DBL1 and DBL2 denote redundancy bit lines; DCe11, DCe12, etc., and DCeij (where, i=m, and j=2) denote redundant memory cells.

Reference numeral 23 denotes a row decoder; 33 denotes a column decoder; 43 denotes a row selector switch array; 44 denotes a redundancy row selector switch array; 53 denotes a write amplifier and sense amplifier; 73 denotes a source line control circuit; and 83 denotes a redundancy position memory ROM and consistency detector.

As this configuration is well-known, a detailed description thereof will be omitted. In the drawings, the source line CSL is arranged in parallel with the word lines in the memory matrix. However, the source line CSL may be arranged in parallel with the bit lines.

FIG. 3 shows an example of a flash memory in which column redundancy is implemented. However, as described above, row redundancy is difficult to realize because of the occurrence of excessive-erasure cells in a conventional flash memory.

The excessive-erasure cell will be described below.

As described with reference to FIG. 2A to 2C, storage of information in a flash memory is based on the fact that a threshold voltage Vth of a memory cell fluctuates depending on whether or not a charge is injected into a floating gate FG. When a charge is injected, the threshold voltage Vth raises. When no charge is injected, that is, when a charge is drawn out, the threshold voltage Vth drops. Using this phenomenon, an intermediate voltage between the two values of the threshold voltage Vth is applied for reading.

Figure 5:
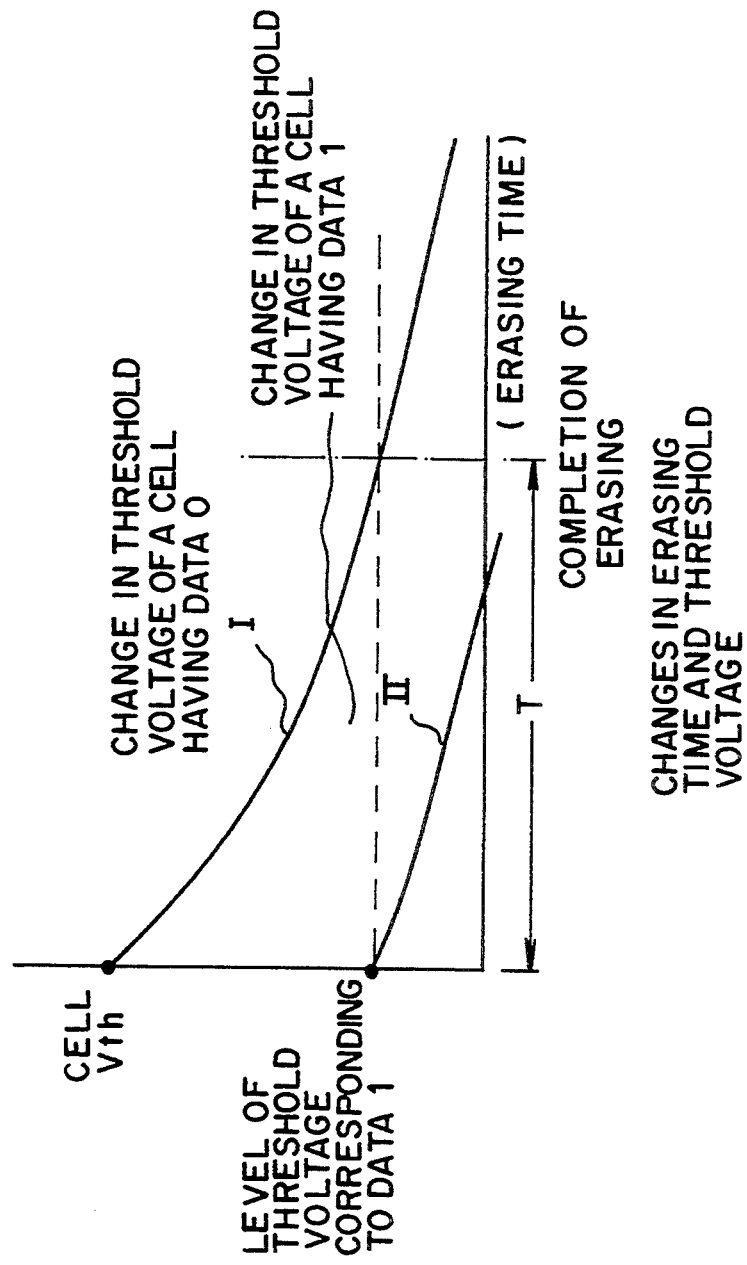
FIG. 5 is an explanatory diagram showing excessive erasure.

As mentioned above, erasing is performed on all cells connected to a common source line. After erasing, the states of the memory cells differ from one another depending on the differences in property among the memory cells and the presence or absence of data in the memory cells. In particular, when excessive electrons are drawn out of a floating gate FG of a memory cell during erasing, the floating gate FG becomes positive. Even if the memory cell is unselected, leakage current flows through the bit line on which the memory cell is connected. As a result, reading cannot be achieved correctly. This memory cell is referred to as an excessive-erasure cell. The influence of an excessive-erasure cell is noticeable during writing. However, the influence during writing is negligible compared with that during reading. The influence during reading alone will therefore be described below. FIG. 5 is an explanatory diagram showing a difference in erase operations for memory cells storing different data.

In general, data "0" represents a state in which electrons are injected into a floating gate FG; that is, writing is performed.

Data "1" represents a state in which no electrons are injected into a floating gate FG. A threshold voltage Vth allowing a memory cell to turn on during reading is higher in a memory cell having a "0" than in a memory cell having a "1". When the voltages indicated in FIG. 2A are applied for reading, the memory cell having a "1" is turned on to allow current to flow through the associated bit line. However, the memory cell having a "0" is turned off so that current does not flow through the associated bit line. Erasing is carried out so that the threshold voltages Vth of all memory cells are reduced to a level corresponding to data "1"; that is, the threshold voltages Vth of memory cells having "0"s are reduced to a level corresponding to data "1". Erasing causes the threshold voltage Vth of a memory cell having a "0" to change as shown in FIG. 5. The threshold voltage Vth of the memory cell having a "0" becomes lower than a level corresponding to data "1". When the threshold voltage decreases to a voltage level which, although a reading voltage (5 V) is not applied to a control gate CG of a memory cell, allows the memory cell to turn on, even if the memory cell is unselected, and leakage current flows through a bit line on which the memory cell is connected. This results in an excessive-erasure state in which reading cannot be achieved correctly. To avoid this state, before erasing is executed, writing is performed on all memory cells irrelevant of the states of the memory cells. Thereafter, erasing is started.

Figure 6:
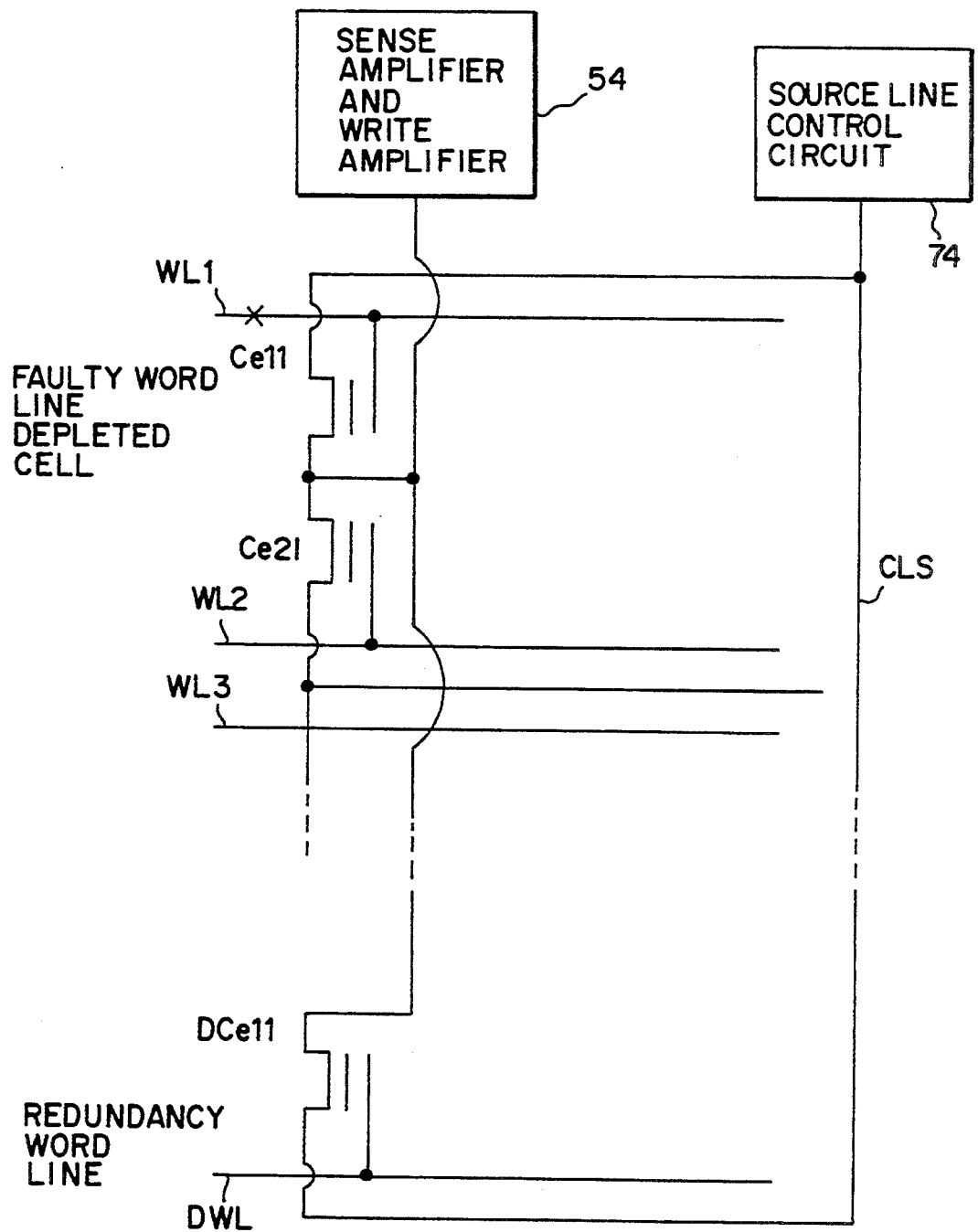
FIG. 6 is an explanatory diagram showing a problem occurring when word redundancy is implemented in a conventional flash memory.

FIG. 6 is an explanatory diagram showing an excessive-erasure cell in a flash memory in which row redundancy is implemented. In FIG. 6, a word line WL1 is replaced with a redundancy word line DWL.

Various factors are conceivable as causes of a fault. For example, a short circuit between a word line WL1 and a source line or a ground line of a device is a cause of a fault. As far as a DRAM or SRAM is concerned, once such a word line is replaced with a redundancy word line, no problem occurs. However, in a flash memory, as described above, erasing is achieved by applying high voltage to the common source line CLS and grounding all word lines in a block. Since the word line WL1 is grounded, the conditions for erasing shown in FIG. 2C are applied to all memory cells connected on the replaced word line WL1. Writing is not performed on the memory cells connected on the replaced word line WL1.

Therefore, after erasing is executed several times, the memory cells are placed in an excessive-erasure state without fail. The memory cells connected on the replaced word line are still connected to bit lines. Therefore, when the memory cells enter the excessive-erasure state, reading is not achieved correctly. Aside from the cause of a fault that the word line WL1 is short-circuited with the source line or ground line in a device, even when the word line WL1 is not grounded, conditions approximate to the conditions for erasing are set up. There is therefore a great possibility that the memory cells may enter the excessive-erasure state gradually.

For the foregoing reason, row redundancy is hard to implement in a flash memory.

As shown in the plan view of a cell matrix in a flash memory in FIG. 4, generally, word lines underlie bit lines. In the process of manufacturing, word lines are formed in an earlier stage than bit lines. The probability of occurrence of a fault resulting from adherent dust or the like is higher in word lines than in bit lines. It is therefore desired that not only bit-line redundancy but also word-line redundancy be performed.

Figure 7:
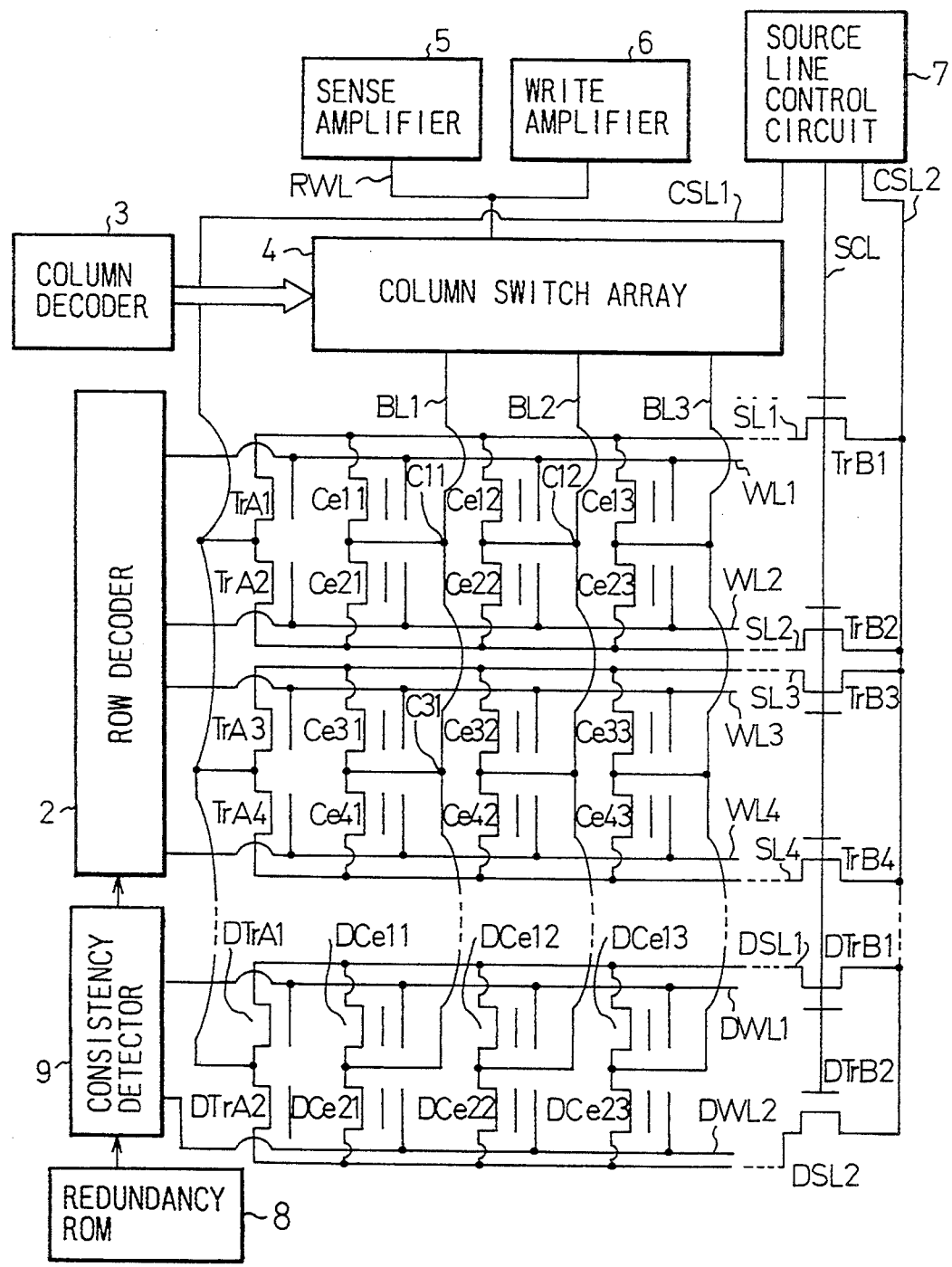
FIG. 7 shows a configuration of a flash memory according to the first embodiment of the present invention.
Figure 8:
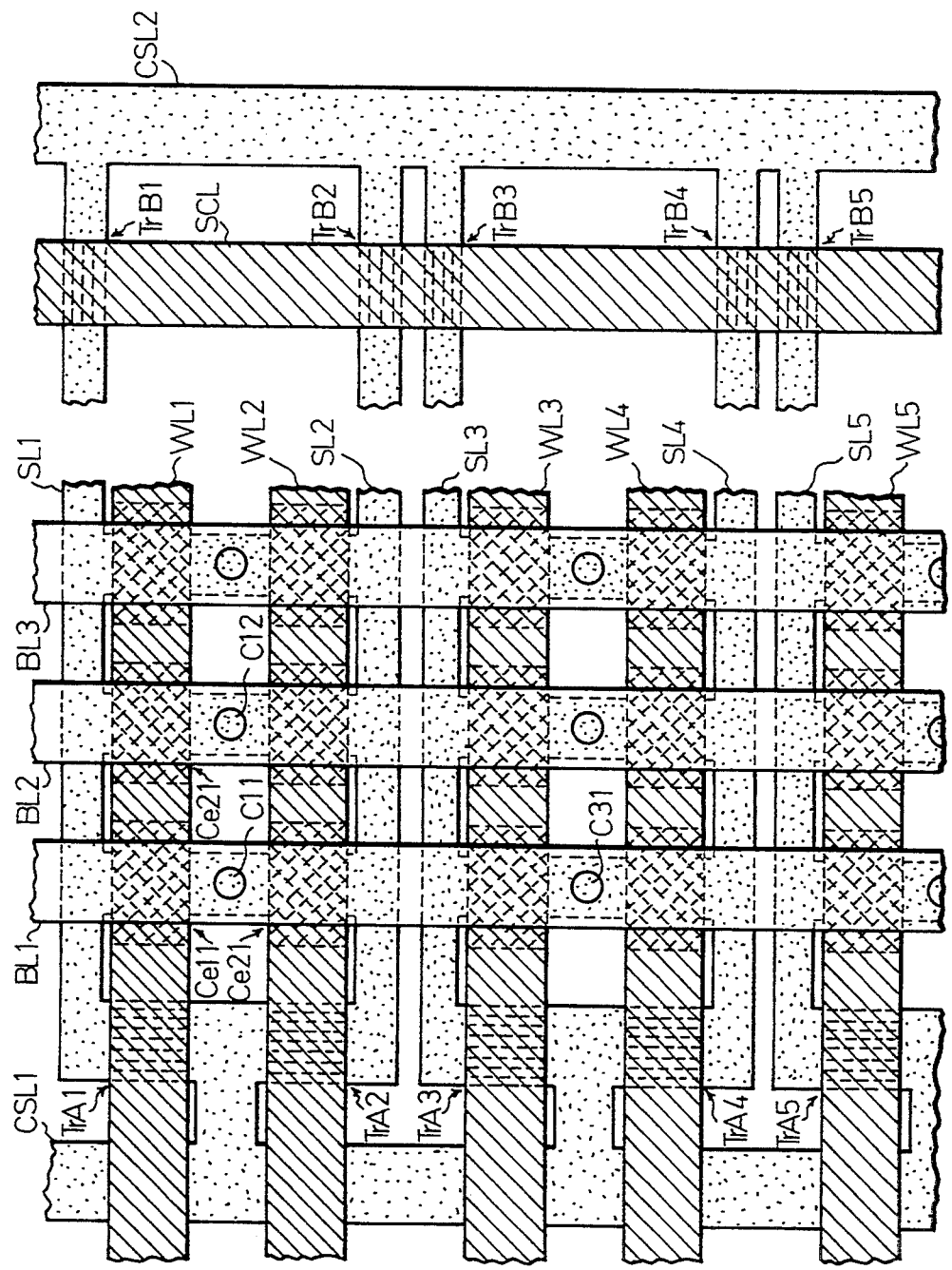
FIG. 8 is a plan view showing a cell matrix in the flash memory of the first embodiment.

FIG. 7 shows a configuration of a first embodiment of the present invention. FIG. 8 is a plan view showing a cell matrix in the flash memory.

In FIG. 7, reference numeral 2 denotes a row decoder; 3 denotes a column decoder; 4 denotes a column selector switch array; 5 denote a sense amplifier; 6 denotes a write amplifier; 7 denotes a source line control circuit; 8 denotes a redundancy position memory ROM; 9 denotes a consistency detector; WL1, WL2, etc.; WLn denotes word lines onto which the row decoder 2 outputs a Selected signal, BL1, BL2, etc.; BLn denotes bit lines; CSL1 denotes a first common source line; CSL2 denotes a second common source line; SL1, SL2, etc.; denote source lines, Ce11, Ce12, etc.; Ceij denotes memory cells; DWL1 and DWL2 denote redundancy word lines; DSL1 and DSL2 denote redundancy source lines, DCe11, DCe12, etc.; DCek1 denote redundant memory cells; TrA1, TrA2, etc., denote first switches; TrB1, TrB2, etc., denote second switches; DTrA1 and DTrA2 denote redundancy first switches; and DTrB1 and DTrB2 denote redundancy second switches.

For reading or writing, the row decoder 2 decodes an address signal, selects a word line on which a memory cell to be accessed is connected, and applies voltage to the word line. For erasing, all word lines in a given block are grounded; that is, 0 V is applied. For reading, 5 V is applied to the selected word line, while 0 V is applied to unselected word lines. For writing, 12 V is applied to the selected word line, while 0 V is applied to the unselected word lines.

For reading or writing, the column decoder 3 decodes an address signal, and outputs a Column Select signal. In response to the Column Select signal, a transistor in the column selector switch array 4 connects a bit line, on which the memory cell to be accessed is connected, to a signal line RWL connected to the sense amplifier 5 or write amplifier 6. For erasing, all the transistors in the column selector switch array 4 enter a break state, and all bit lines enter a floating state.

For reading, the sense amplifier 5 applies 1V to the signal line RWL and determines whether current flows through the signal line or selected bit line. For writing, the write amplifier 6 sets the signal line RWL to 6 V or 0 V depending on data to be written.

For reading or writing, the source line control circuit 7 sets the first common source line CSL1 to 0 V and sets the second switch control line SCL to a voltage causing all the second switches to turn off. For erasing, the source line control circuit 7 sets the second switch control line SCL to a voltage causing all the second switches to turn on.

The redundancy ROM 8 stores an address of a faulty word line replaced with another one. The consistency detector 9 compares an address signal with the address of the word line stored in the redundancy ROM 8. If the address values are mutually consistent, the consistency detector 9 outputs a signal indicating that the row decoder 2 should not select the replaced word line, and applies a voltage permitting selection of a redundant word line. The redundancy ROM 8 has a storage capacity large enough to store addresses of word lines by the number of redundant word lines. Needless to say, the consistency detector 9 can compare an address signal with addresses of word lines by the number of redundant word lines.

A detailed circuit having the aforesaid circuit elements is well-known, so a description thereof will be omitted.

Next, the operation in this embodiment will be described on the assumption that the word line WL1 has been replaced with the redundant word line DWL1.

First, the memory cell Ce21 is accessed. For reading data from the memory cell Ce21, the source line control circuit 7 sets the second switch control line SCL to a voltage causing the second switch to turn on. All the source lines SL1, SL2, etc., are therefore separated from the second common source line CSL2. At this time, the source line control circuit 7 sets the first common source line CSL1 to 0 V. About 5 V is applied to the word line WL2, and 0 V is applied to the other word lines. About 1 V is applied to the bit line BL1, and 0 V is applied to the other bit lines. This causes the first switch TrA2 alone to turn on. The source line SL2 is connected to the first common source line CSL1 to be at 0 V. The other source lines are placed in a floating state. The conditions for reading indicated in FIG. 2A are therefore applied only to the memory cell Ce21. Reading is not performed on the other memory cells. Even when the other memory cells connected to the bit line BL1; in particular, the memory cell Ce11 connected to the replaced word line WL1, are in an excessive-erasure state, since the source line SL1 on with the memory cell Cell is connected is in the floating state, no current flows from the bit line BL1 into the source line SL1 via the memory cell Ce11. Current flowing from the bit line BL1 into the memory cell Ce21 can be detected correctly.

For writing a "0", about 12 V is applied to the word line WL2, about 6 V is applied to the bit line BL1, and 0 V is applied to the first common source line CSL1. The first switch TrA2 is, similarly to that in reading, turned on. The voltage conditions indicated in FIG. 2B are applied. For writing a "1", 0 V is applied to the bit line BL1. No charge is therefore injected to the floating gate FG. The operation is identical to that for writing a "0".

For erasing, 0 V is applied to all the word lines 2A, and all the bit lines are open. All the second switches TrB1, TrB2, etc., are turned on. To the second common source line CSL2, 12 V is applied. The conditions for erasing indicated in FIG. 2C are applied to all the memory cells except those arrayed on the replaced row and on a redundant row unused for replacement.

For reading or writing, when access is obtained to a memory cell connected to the replaced word line WL1, the consistency detector 9 detects that the address of the memory cell is consistent with the address stored in the redundancy ROM 8, inhibits the row decoder 2 from supplying a voltage permitting selection of the word line WL1, and allows the row detector 2 to output a voltage permitting selection of the redundant word line DWL1. The aforesaid conditions for reading and writing are applied to the memory cells connected to the redundant word line DWL1. Operation similar to that performed when a normal memory cell is then accessed is carried out.

FIG. 8 is a plan view of a cell matrix in the first embodiment.

Reference numerals in FIG. 8 denote the same circuit elements as those in FIG. 7. References C11, C12, etc., denote contact holes for connecting the bit lines BLi with active regions equivalent to drains of memory cells.

The word lines are formed in the second layer made of polysilicon; the bit lines are formed in the top layer made of aluminum; the source lines and drains are formed in a diffused layer; and the floating gates are formed in the first layer made of polysilicon.

In FIG. 8, memory cells have the same structure as those in a conventional flash memory. The first switches TrA1, TrA2, etc., and the second switches TrB1, TrB2, etc., are arranged across word lines. Thus, a flash memory in which word redundancy is implemented according to the present invention is realized without a great increase in chip area.

As apparent from a comparison between the cell matrices in the flash memory of the first embodiment in FIG. 7 and the conventional flash memory in FIG. 3, source lines in the conventional flash memory are arranged at the rate of one line per two rows, but source lines in the flash memory of the first embodiment are arranged at the rate of one line per one row. As also apparent from a comparison between FIGS. 8 and 4, the number of source lines arranged in parallel with word lines in the flash memory of the first embodiment is double the number of those in the conventional flash memory. This results in increased chip area. In the second embodiment, similarly to the flash memory in FIG. 3, source lines are arranged on every other row.

Figure 9:
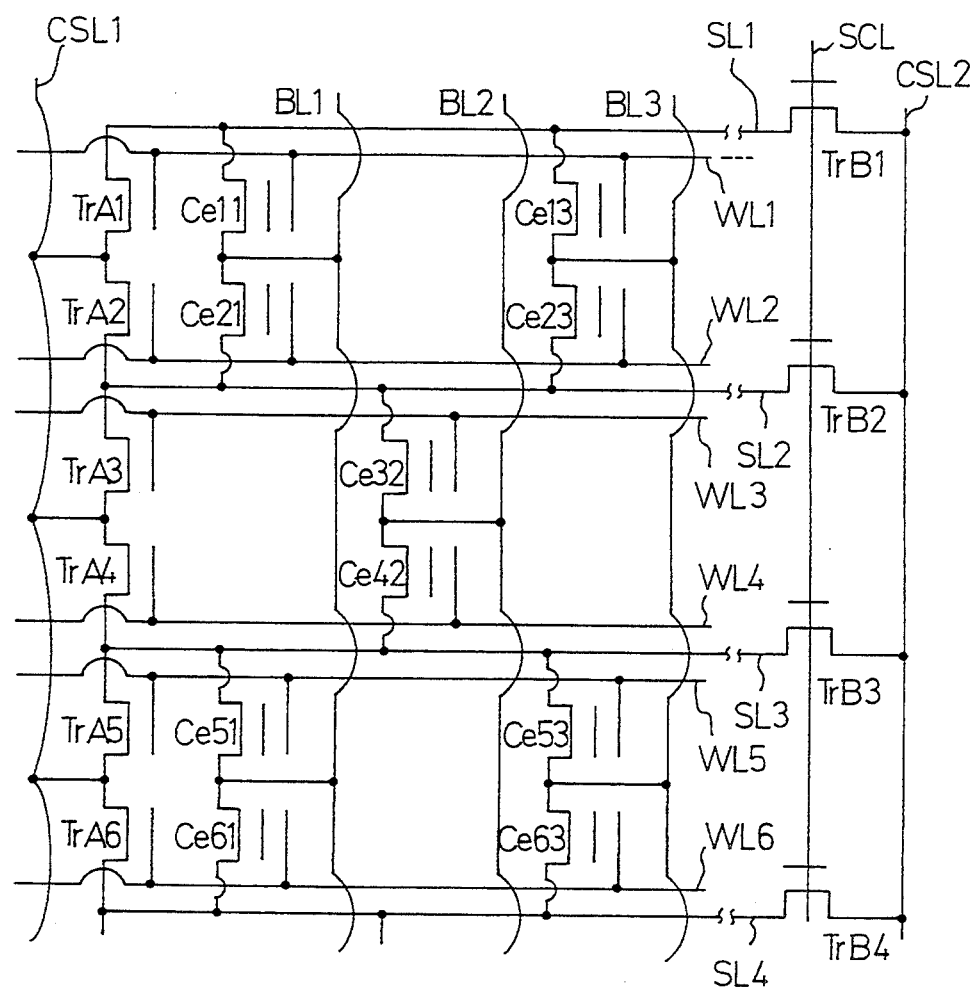
FIG. 9 shows a configuration of a flash memory according to the second embodiment of the present invention.
Figure 10:
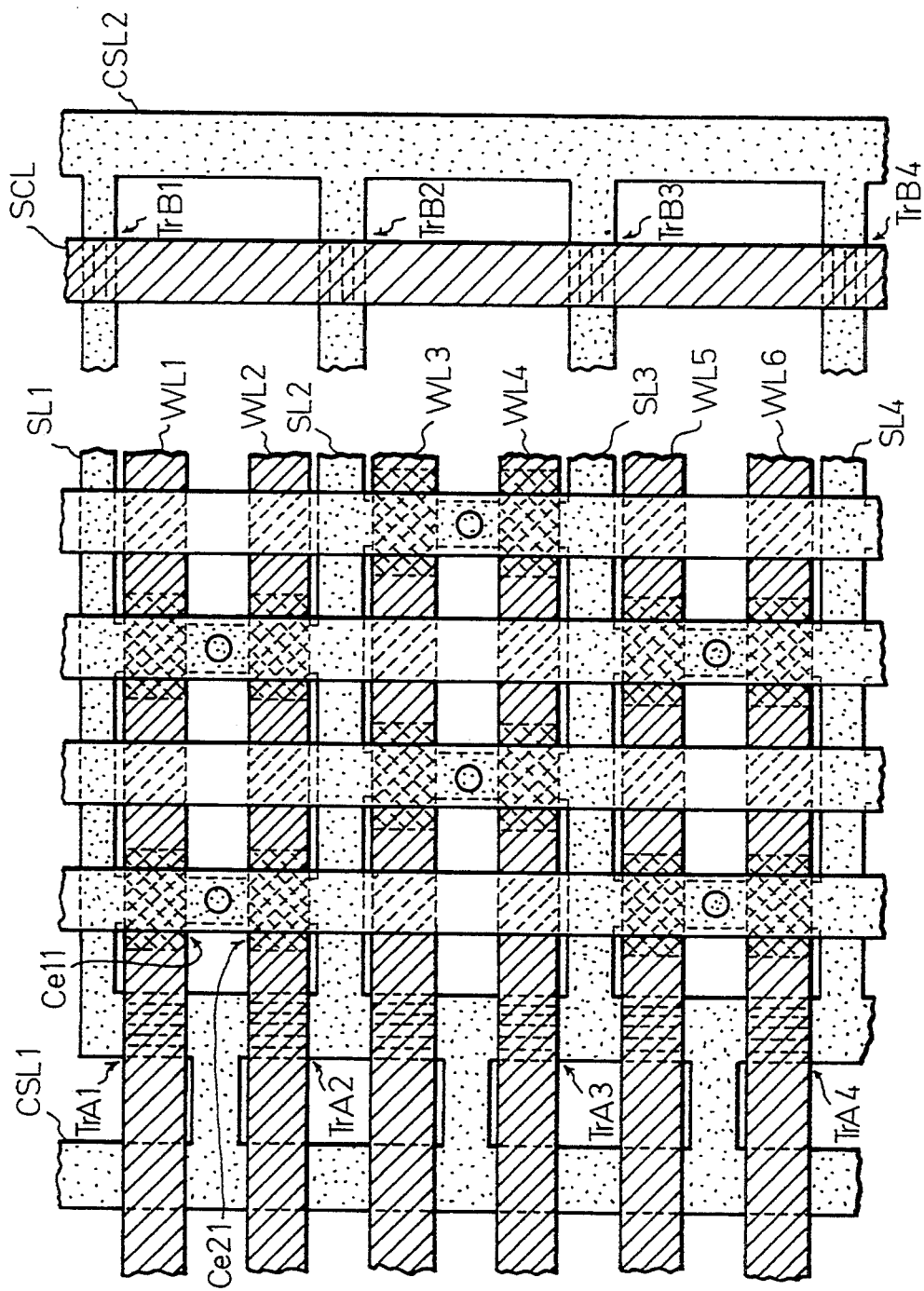
FIG. 10 is a plan view showing a cell matrix in the flash memory of the second embodiment.

FIG. 9 shows the circuitry of a cell matrix in a flash memory of the second embodiment. FIG. 10 is a plan view of the cell matrix. Components other than the cell matrix are identical to those in FIG. 7. The operation of the flash memory of the second embodiment is identical to that of the first embodiment, of which a detailed description will be omitted. Only the differences will be described.

As shown in FIG. 9, in the second embodiment, unlike the first embodiment, a source line is shared between two adjoining memory cell rows. The memory cells Ce12, Ce22, and Ce31 are excluded. This is intended to prevent the memory cells on two adjoining rows connected to the same source line from being connected to the same bit line. Assuming that the two adjoining memory cell rows connected to the same source line are connected to the same bit line, when one of the rows is replaced with a redundant memory cell row, if the replaced memory cells enter an excessive-erasure state, the memory cells on the other row cannot be read correctly.

The circuitry of the second embodiment can be also represented as follows. Source lines are arranged on every other row, and a source line is shared between two adjoining memory cell rows. Bit lines are divided into two systems. Memory cells on adjoining rows on the same column are connected to bit lines of different systems.

As apparent from comparison between FIGS. 7 and 9 or FIGS. 8 and 10, in the second embodiment, the number of source lines is smaller but memory cells are thinned out or halved. This results in a deterioration of the density of memory cells, which is unfavorable in terms of high-density integration. It is the third embodiment that has overcome these drawbacks.

Figure 11:
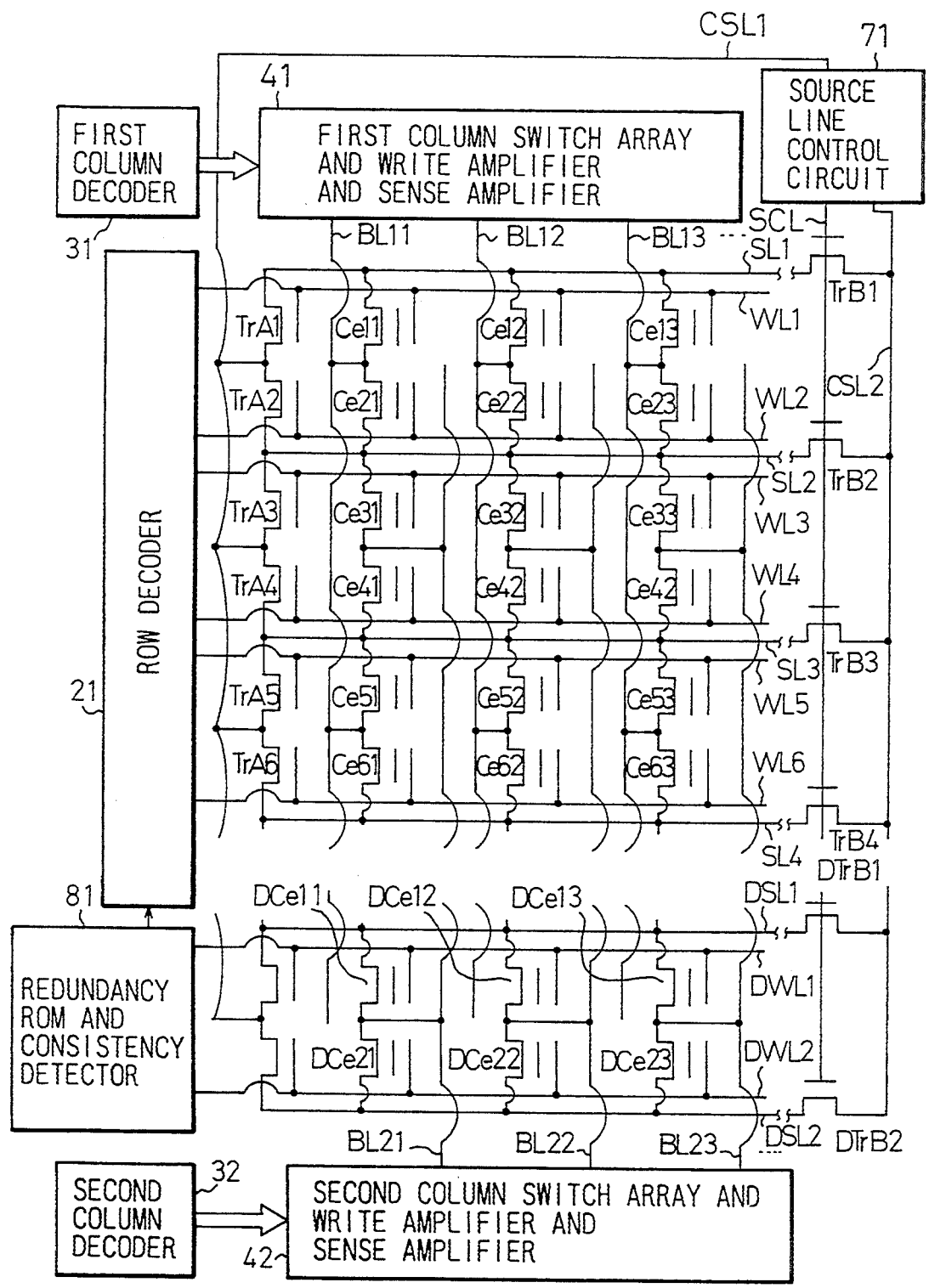
FIG. 11 shows a configuration of a flash memory according to the third embodiment of the present invention.
Figure 12:
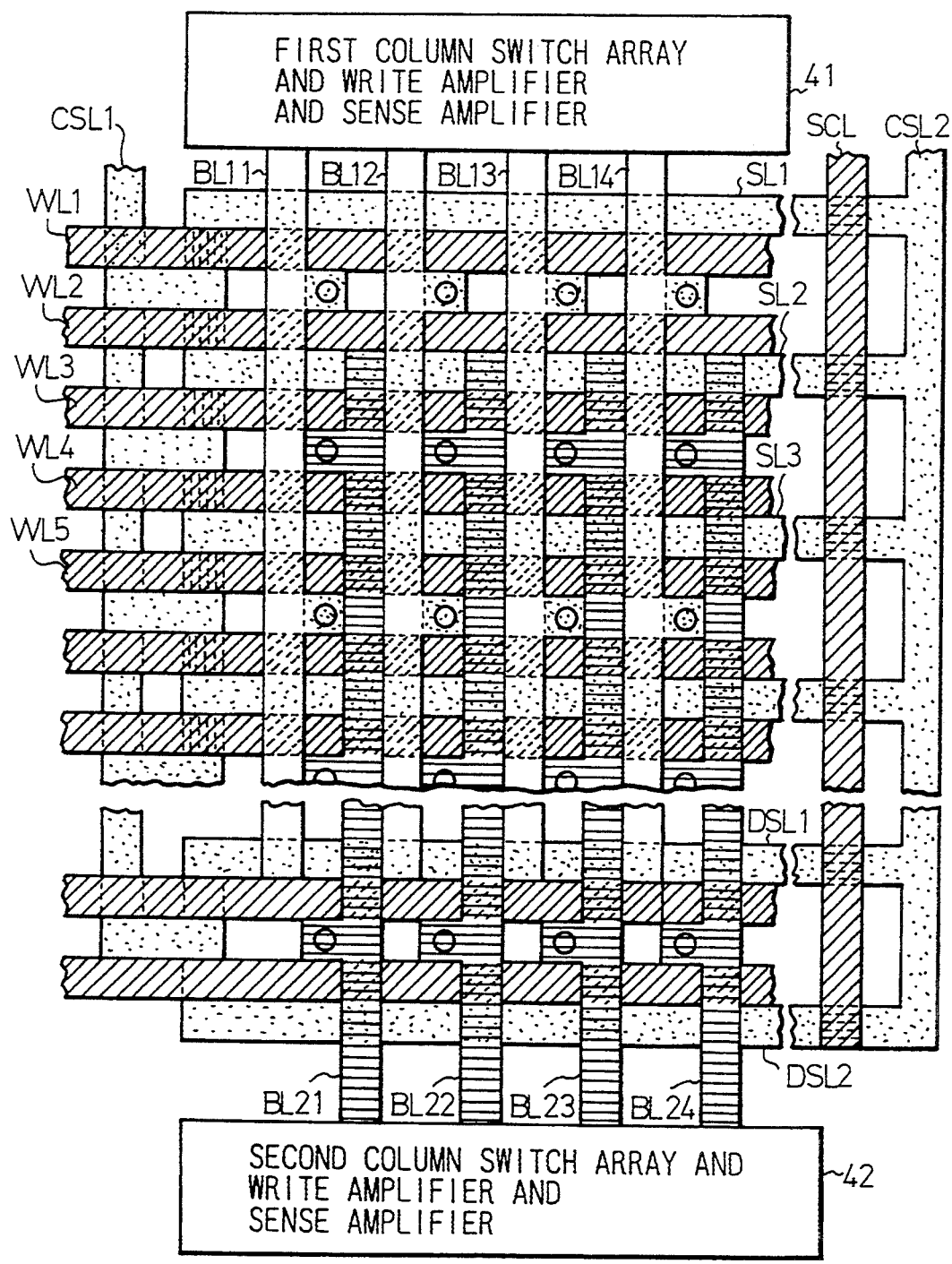
FIG. 12 is a plan view showing a cell matrix in the flash memory of the third embodiment.

FIG. 11 shows the circuitry of a flash memory of the third embodiment. FIG. 12 is a plan view of a memory cell matrix in the flash memory. The operation of the third embodiment is identical to that of the first or second embodiment, so a detailed description thereof will be omitted. Only the differences will be described.

As shown in FIGS. 11 and 12, the flash memory of the third embodiment has two column selector switch arrays arranged above and below the cell matrix. There are also provided two sets of column decoders, sense amplifiers, and write amplifiers. Bit lines are divided into two systems. Bit lines belonging to one of the two systems are connected to the upper column selector switch array. Bit lines belonging to the other system are connected to the lower column selector switch array. The bit lines of the two systems are provided alternately. Memory cells on adjoining rows on the same column are connected to bit lines of different systems. Even when access is given to a memory cell on one of rows sharing a source line on which a replaced memory cell row is connected, since the bit lines connected are different from each other, no problem occurs.

Even in the flash memory configured as shown in FIG. 11, if the bit lines of two systems are formed in the same layer, since adjoining lines must be interspaced to some extent, the degree of integration does not improve very much. In the flash memory of the third embodiment, as shown in FIG. 12, bits lines of two systems are formed in different layers in an effort to minimize the space between adjoining bit lines. This results in an increased number of layers. However, high-density integration is accomplished.

As described above, according to the present invention, when word redundancy is implemented in a flash memory, even if memory cells on a replaced word line (row) enter an excessive-erasure state, reading of the other memory cells will not be adversely affected. Thus, word line redundancy can be implemented in a flash memory.

I claim:

1. A nonvolatile semiconductor memory comprising:
   a plurality of word lines in parallel formation;
   a plurality of bit lines in parallel formation, said bit lines being perpendicular to said word lines;
   a plurality of nonvolatile memory cells each of which includes: a control electrode connected to one of said word lines; a first electrode connected to one of said bit lines; and a second electrode connected to one of source lines;
   one or more redundant word lines; and
   a plurality of redundant nonvolatile memory cells each of which includes: a control electrode connected to one of said redundant word lines; a first electrode connected to one of said bit lines; and a second electrode connected to one of said source lines;
   if faults occur in said nonvolatile memory cells, redundant word lines are used to replace the faulty memory cell with said redundancy nonvolatile memory cell in units of a word line, wherein:
   said source lines are a plurality of lines arranged in one-to-one correspondence with and in parallel with said word lines or said redundant word lines;
   said source lines are connected to a first common source line via first switch means that have the gates thereof connected to said word lines and that selectively conduct owing to voltage applied to said word lines for reading or writing;
   said source lines are connected to a second common source line via second switch means that selectively conduct for erasing; and
   for reading or writing, a source line on which a nonvolatile memory cell concerned is connected is selectively connected to said first common source line, and the other source lines are placed in a floating state.

2. A nonvolatile semiconductor memory according to claim 1, wherein two source lines connected to nonvolatile memory cells which are connected to two adjoining word lines are arranged across two adjoining rows of said nonvolatile memory cells.

3. A nonvolatile semiconductor memory according to claim 2, wherein two adjoining source lines are united together.

4. A nonvolatile semiconductor memory according to claim 3, wherein said bit lines are divided into two systems; and said nonvolatile memory cells, which are connected to two adjoining word lines and said united source line, are connected to bit lines of different systems in units of a row.

5. A nonvolatile semiconductor memory according to claim 4, wherein said nonvolatile memory cells connected to two adjoining bit lines of different systems are arranged in a straight line.

6. A nonvolatile semiconductor memory according to claim 4, wherein said nonvolatile memory cells, which are connected to two adjoining bit lines of different systems are arranged in stagger.

7. A nonvolatile semiconductor memory according to claim 4 further comprising two column selector gates arranged above and below a matrix composed of said nonvolatile memory cells, wherein said two systems of bit lines are respectively connected to said two column selector gates.

8. A nonvolatile semiconductor memory according to claim 4, wherein said two systems of bit lines are formed in different layers of an integrated circuit.

9. A nonvolatile semiconductor memory according to claim 5, wherein said two systems of bit lines are formed in different layers of an integrated circuit.

10. A nonvolatile semiconductor memory according to claim 7, wherein said two systems of bit lines are formed in different layers of an integrated circuit.

* * * * *